United States Patent [19]

Miyanishi

[11] Patent Number: 5,550,493
[45] Date of Patent: Aug. 27, 1996

[54] POTENTIAL COMPARING CIRCUIT HAVING AN OFFSET CORRECTING CIRCUIT

[75] Inventor: Hideji Miyanishi, Toyonaka, Japan

[73] Assignee: Ricoh Company Ltd., Tokyo, Japan

[21] Appl. No.: 307,891

[22] Filed: Sep. 16, 1994

[30] Foreign Application Priority Data

Sep. 21, 1993 [JP] Japan .................................. 5-234417

[51] Int. Cl.⁶ .............................. H03K 5/22; H03L 5/00
[52] U.S. Cl. .......................... 327/66; 327/89; 327/307
[58] Field of Search ........................... 327/51–57, 63–89,
327/306, 307, 560–563; 330/257, 261

[56] References Cited

U.S. PATENT DOCUMENTS

| | | | |
|---|---|---|---|
| 4,047,059 | 9/1977 | Rosenthal | 327/66 |
| 4,724,397 | 2/1988 | Davis | 330/257 |
| 4,788,510 | 11/1988 | Wozniak | 327/68 |
| 5,115,204 | 5/1992 | Tomonaga | 330/257 |
| 5,422,529 | 6/1995 | Lee | 327/536 |
| 5,444,413 | 8/1995 | Kimura et al. | 327/563 |

FOREIGN PATENT DOCUMENTS

| | | |
|---|---|---|
| 119589 | 7/1984 | Japan . |
| 236190 | 11/1985 | Japan . |

*Primary Examiner*—Toan Tran
*Attorney, Agent, or Firm*—Cooper & Dunham LLP

[57] ABSTRACT

There is provided a potential comparing circuit of which output potential is almost equal to specific determining potential levels used in a next-stage logic circuit. The potential comparing circuit has a current-mirror circuit, a first transistor, a second transistor and an offset correcting circuit. The current-mirror circuit is connected to a first power source. The first transistor has a gate to which a first input signal is supplied. The second transistor has a gate to which a second input signal is supplied, a channel type of the second transistor being the same as a channel type of the first transistor. The offset correcting circuit is provided between a drain of the first transistor and an input point of the current-mirror circuit, for correcting a potential level obtained at a drain of the first transistor to correspond to specific potential levels related to the specific determination potential levels. The output signal being output from a point between the drain of the second transistor and the output point of the current-mirror circuit.

13 Claims, 8 Drawing Sheets

POTENTIAL COMPARING CIRCUIT HAVING AN OFFSET CORRECTING CIRCUIT

BACKGROUND OF THE INVENTION

The present invention generally relates to a potential comparing circuit, and more particularly to a potential comparing circuit used for a memory device or an A/D converter.

Figure 1:
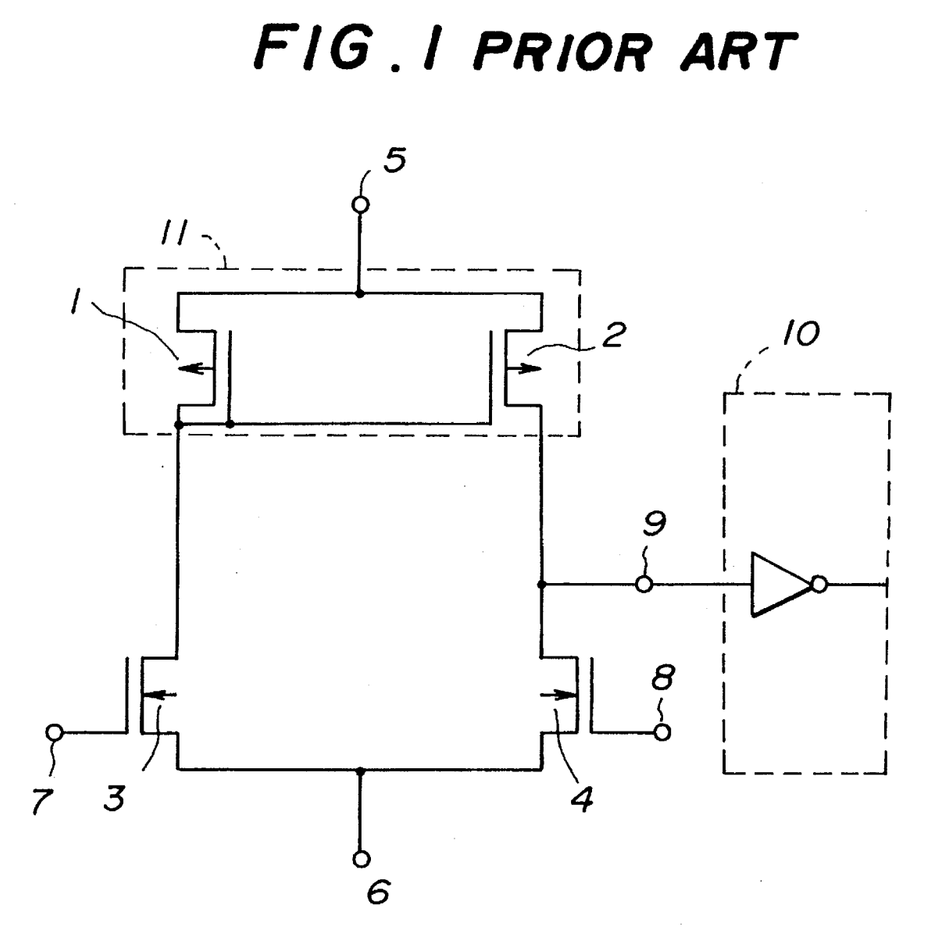
FIG. 1 is a circuit diagram of a conventional potential comparing circuit.

FIG. 1 is a circuit diagram of a conventional potential comparing circuit. The potential comparing circuit shown in FIG. 1 comprises an input transistor (p-type) 1, an output transistor (p-type) 2, a normal input active transistor 3 (n-type) and an inverse input active transistor 4 (n-type). The input transistor 1 and the output transistor 2 constitute a current-mirror circuit 11.

A power input terminal 5 is provided on the current-mirror circuit side, and another power input terminal 6 is provided on the active transistor side. A normal input terminal 7 is provided to the active transistor 3 and an inverse input terminal 8 is provided to the active transistor 4.

An output terminal 9 is connected to a connection point between a drain of the active transistor 4 and a drain of the output transistor 2 of the current-mirror circuit 11. The output terminal 9 is connected to an input terminal of a next-stage logic circuit 10 which comprises, for example, an inverter.

The current-mirror circuit 11 has a saturation current characteristic proportional to a current flowing in the active transistor 3 of the normal input side, and acts as a load against the active transistor 4 of the inverse input side. Output potential level of the output terminal 9 is determined by the load.

If the normal input and inverse input are at the same potential level, each of the active transistors 3 and 4 shows the same saturation current characteristic, and thus the output transistor 2 of the current-mirror circuit 11 also shows a saturation current characteristic proportional to the saturation current characteristic of the active transistors 3 and 4. In this state, if a conductance of each of the transistors 1, 2, 3 and 4 has been adjusted so that the saturation current of the active side becomes equal to that of the load side, a predetermined fixed potential level determined by an intersection of characteristic curves of the active side and the load side is obtained at the output terminal 9. The predetermined fixed potential level is somewhere between potential levels of power sources of the active side and the current-mirror side.

If the potential level of the inverse input shifts in a direction in which the saturation current of the active transistor 4 increases, the intersection of the characteristic curves shifts toward the potential level of the power source of the active side transistor. On the other hand, in a reverse condition, the intersection shifts toward the potential level of the power source of the current-mirror circuit side. In this way, the input potential levels can be compared with each other.

However, in the above-mentioned conventional potential comparing circuit, a determination error may occur in the comparison result because the potential level (comparison result potential level) at the output terminal 9, which potential level is obtained in a condition in which both input potential levels are the same, does not always equal to specific determination potential levels, corresponding to "0" and "1", of the next-stage logic circuit 10.

It is considered that there are two causes for the above determination error. One cause is that the output potential level of the potential comparing circuit, when both of the input potential levels are the same, varies according to the potential level of both of the input potential levels. This cause is dependent on a characteristic of the MOS diode of the current-mirror circuit 11.

The other cause is that a characteristic of the output potential level of the potential comparing circuit against a fluctuation in the power source voltage, when both of the input potential levels are the same, differs from that of the next-stage logic circuit 10. That is, the output potential level of the potential comparing circuit is determined by an intersection of a characteristic curve of a MOS diode and the saturation current characteristic curve, while the determination potential level of the next-stage logic circuit 10 is determined by an intersection of saturation current characteristic curves of a p-type MOS transistor and an n-type MOS transistor, these transistors constituting the next-stage logic circuit 10.

Figure 2A:
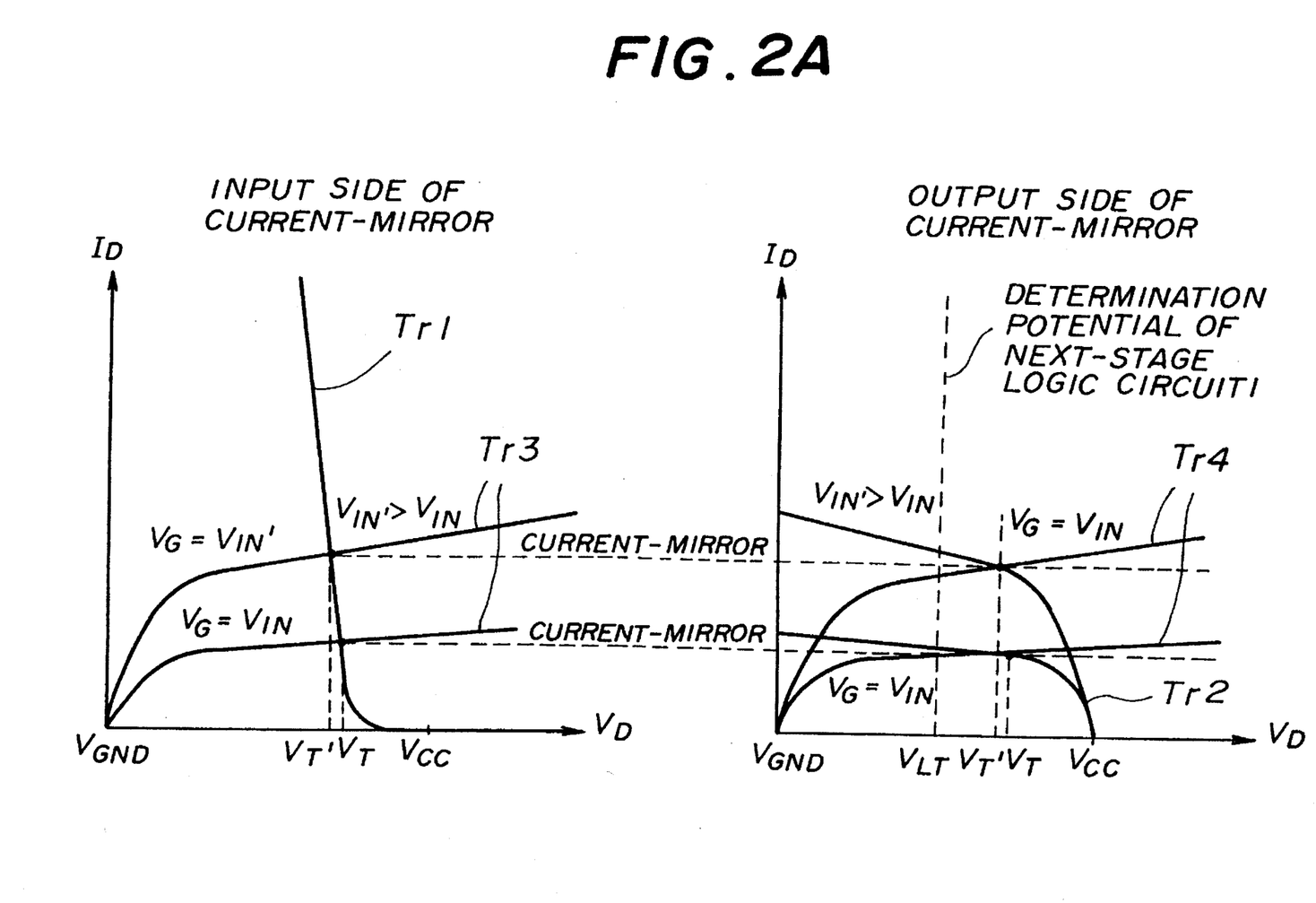
FIGS. 2A and 2B are graphs showing drain voltage - drain current characteristic curves of the transistors shown in FIG. 1.
Figure 2B:
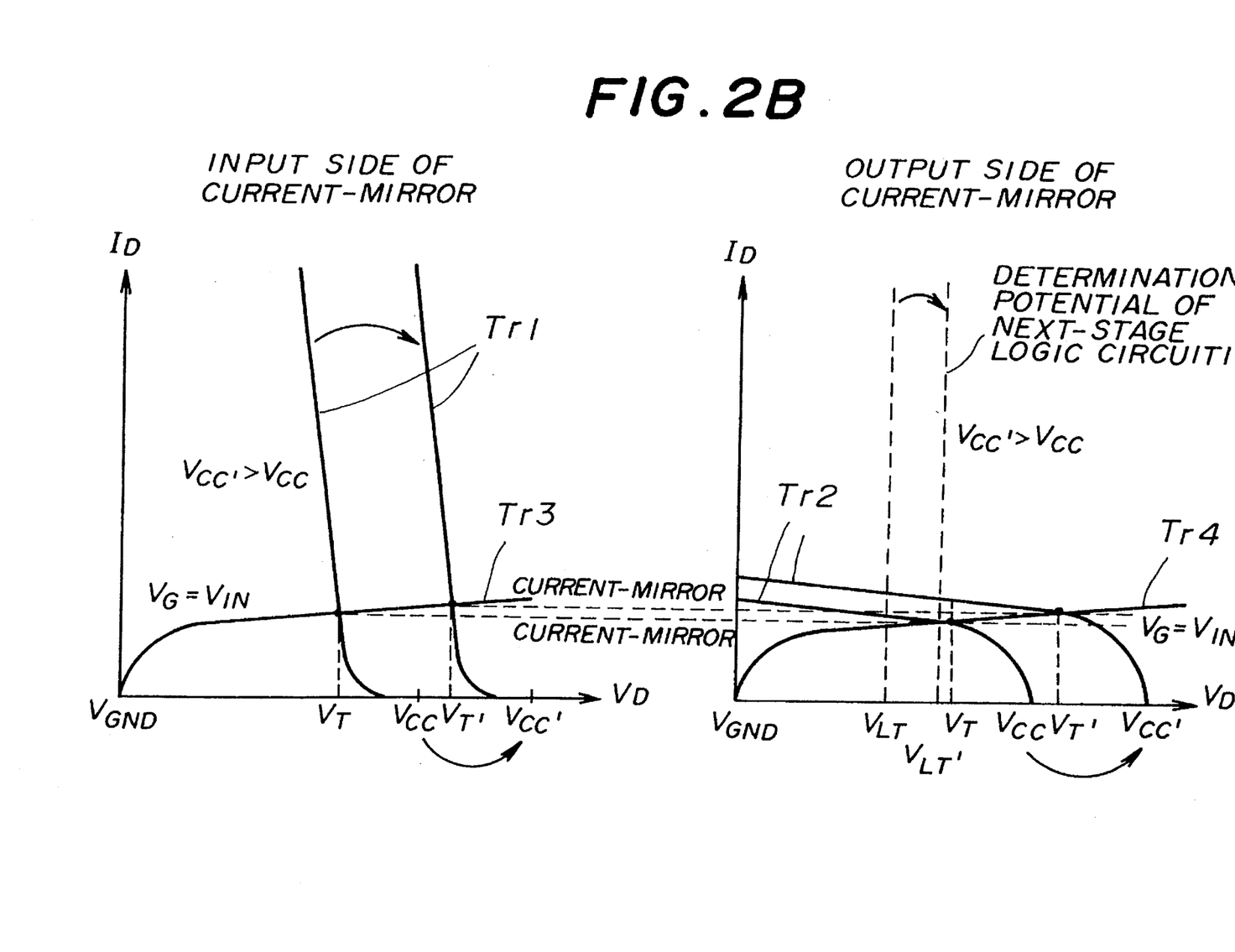

FIGS. 2A and 2B are graphs showing drain voltage (V) - drain current ($V_I$) characteristic curves Tr1, Tr2, Tr3, and Tr4 of the transistors 1, 2, 3 and 4, respectively. FIG. 2A shows curves obtained when the same potential $V_{IN}$ or $V_{IN}'$ ($V_{IN} > V_{IN}'$) is applied to each of the input terminals 7 and 8. In FIG. 2A, the graph on the left side shows characteristic curves of the input side of the current-mirror circuit 11, and the graph on the right side shows characteristic curves of the output side of the current-mirror circuit 11. FIG. 2B shows characteristic curves obtained when the same potential $V_{IN}$ is applied to each of the input terminals 7 and 8 and when the potential level of the power input terminal 5 of the current-mirror circuit side is varied from $V_{CC}$ to $V_{CC}'$. In FIG. 2B, the graph on the left side shows characteristic curves of the input side of the current-mirror circuit 11, and the graph on the right side shows characteristic curves of the output side of the current-mirror circuit 11.

As shown in FIG. 2A, the output potential levels $V_T$ and $V_T'$ are determined according to the potential levels at the input terminals 7 and 8, respectively. That is, as shown in the graph on the left side of FIG. 2, the output potential levels $V_T$ and $V_T'$ are determined by an intersection of a MOS diode characteristic curve Tr1 of the transistor 1 and the saturation current characteristic curves Tr3 of the transistor 3. Since the MOS diode characteristic curve Tr1 of the transistor 1 inclines relative to a direction perpendicular to the $V_D$ axis, the drain voltage is shifted from $V_T$ to $V_T'$. Accordingly, even if the characteristic of the transistors 1 and 2 are adjusted so that the output potential $V_T'$, when the gate voltage $V_G$ of the transistor 3 is equal to $V_{IN}'$, corresponds to the specific determination potential levels corresponding to "1" and "0" of the next-stage logic circuit 10, the output potential level is shifted to the higher potential level $V_T$, and thus the determination error (offset) occurs.

Additionally, as shown in FIG. 2B, the characteristic curve Tr1 of the transistor 1 is shifted parallel by a difference between $V_{CC}$ and $V_{CC}'$ in a direction along the $V_D$ axis. Accordingly, the output potential level of the potential comparing circuit is shifted from $V_T$ to $V_T'$ in a direction along the $V_D$ axis.

On the other hand, the determination potential $V_{LT}$ of the next-stage logic circuit 10 is approximated as $\alpha V_{CC}$ ($V_{LT} = \alpha V_{CC}$), and $V_T'$ is approximated as $\alpha V_{CC}'$ ($V_T' = \alpha V_{CC}'$), where a is a constant less than 1 and $V_{GND}$ is equal to 0 volt. From the above, the following relationship is obtained.

$$V_{LT}-V_{LT}'=\alpha(V_{CC}-V_{CC}')$$

It is apparent from the above relationship, $V_{LT}-V_{LT}'$ is less than $V_T-V_T'$ because $V_T-V_T'$ is approximated as $V_{CC}-V_{CC}'$. Accordingly, even if $V_T$ is rendered to be equal to $V_{LT}$ by adjusting the characteristic of each of the transistors 1 and 2, the determination error may occur when the power source potential level changes to $V_{CC}'$.

SUMMARY OF THE INVENTION

It is a general object of the present invention to provide an improved and useful potential comparing circuit in which the above-mentioned problems are eliminated.

A more specific object of the present invention is to provide a potential comparing circuit of which output potential is almost equal to specific determining potential levels used in a next-stage logic circuit.

In order to achieve the above-mentioned objects, there is provided according to one aspect of the present invention a potential comparing circuit which compares a potential level of a first input signal with a potential level of a second input signal so as to output an output signal having a potential level to be supplied to a next-stage logic circuit which uses predetermined determination potential levels corresponding to "1" and "0", the potential comparing circuit comprising:

a current-mirror circuit, connected to a first power source, having an input point and an output point;

a first transistor having a gate to which the first input signal is supplied;

a second transistor having a gate to which the second input signal is supplied, a channel type of the second transistor being the same as a channel type of the first transistor, a source of the second transistor being connected to a source of the first transistor, a drain of the second transistor being connected to the output point of the current-mirror circuit, a second power source being connected to a connection point between the source of the first transistor and the source of the second transistor; and an offset correcting circuit, provided between a drain of the first transistor and the input point of the current-mirror circuit, for correcting a potential level obtained at a drain of the first transistor to correspond to specific potential levels related to the specific determination potential levels, the output signal being output from a point between the drain of the second transistor and the output point of the current-mirror circuit.

According to the above-mentioned invention, since a potential level of the drain of the first transistor can be close to the determination potential level used in the next-stage logic circuit, output signal can have a potential level close to the determination potential level used in the next-stage logic circuit. Thus an occurrence of an offset of output potential can be minimized.

Additionally, there is provided according to another aspect of the present invention a potential comparing circuit which compares a potential level of a first input signal with a potential level of each of a plurality of second input signals so as to output a plurality of output signals each having a potential level to be supplied to a next-stage logic circuit which uses predetermined determination potential levels corresponding to "1" and "0", the potential comparing circuit comprising:

a current-mirror circuit, connected to a first power source, having an input point and a plurality of output points;

a first transistor having a gate to which the first input signal is supplied;

a plurality of second transistors each having a gate to which a corresponding one of the second input signals is supplied, a channel type of each of the second transistors is the same as a channel type of the first transistor, a source of each of the second transistor being connected to a source of the first transistor, a drain of each of the second transistors being connected to a corresponding one of the output points of the current-mirror circuit, a second power source being connected to the source of the first transistor; and an offset correcting circuit, provided between a drain of the first transistor and the input point of the current-mirror circuit, for correcting a potential level obtained at a drain of the first transistor to correspond to specific potential levels related to the specific determination potential levels, the output signals being output from a point between the drain of each of the second transistors and each of the output points of the current-mirror circuit.

According to the above-mentioned invention, each of a plurality of second input signals can be compared with the first input signals with a single offset-correcting circuit, and thus the potential comparing circuit can be a simple construction and the number of circuit elements can be reduced.

Other objects, features and advantages of the present invention will become more apparent from the following detailed description when read in conjunction with the accompanying drawings.

DETAILED DESCRIPTION OF THE PREFERRED EMBODIMENTS

Figure 3:
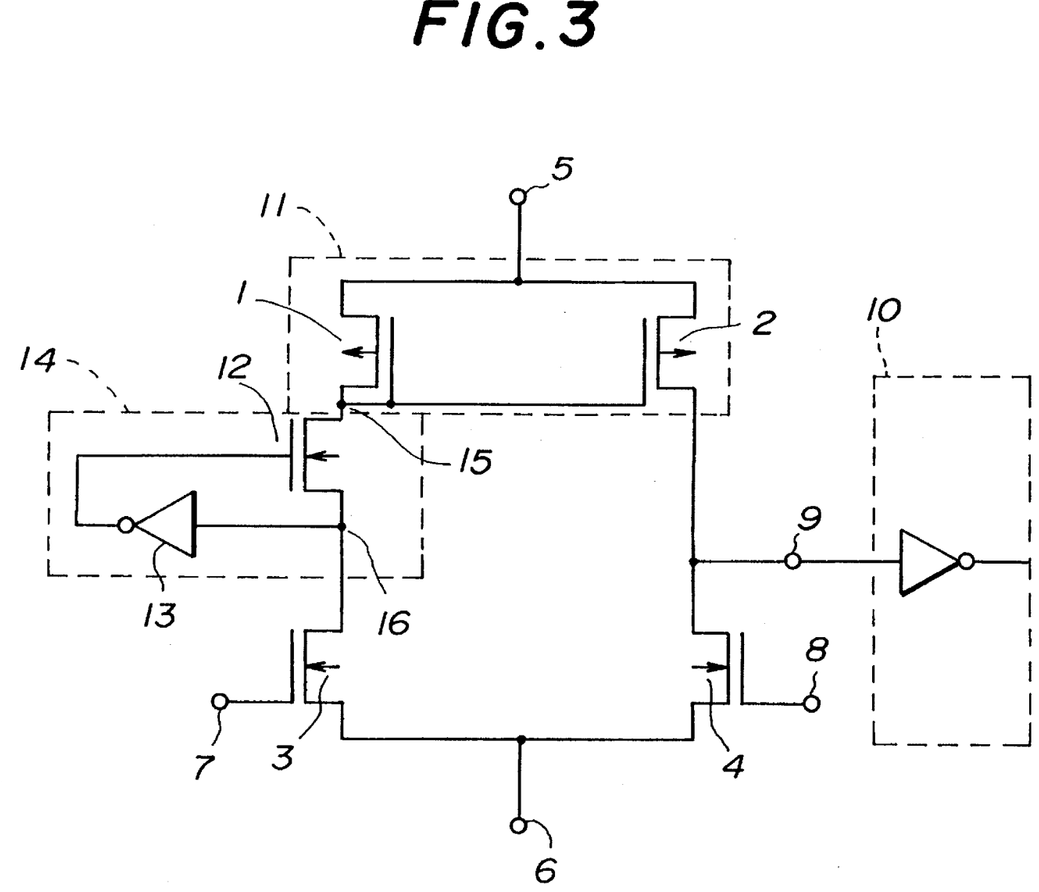
FIG. 3 is a circuit diagram of a first embodiment of a potential comparing circuit according to the present invention.

A description will now be given of a first embodiment of a potential comparing circuit according to the present invention. FIG. 3 is a circuit diagram of a first embodiment of a potential comparing circuit according to the present invention. In FIG. 3, parts that are the same as the parts shown in FIG. 1 are given the same reference numerals.

Similarly to the potential comparing circuit shown in FIG. 1, the potential comparing circuit of the first embodiment according to the present invention shown in FIG. 3 comprises an input transistor (p-type) 1, an output transistor (p-type) 2, a normal input active transistor 3 (n-type) and an inverse input active transistor 4 (n-type). The input transistor 1 and the output transistor 2 constitutes a current-mirror circuit 11.

A power input terminal 5 is provided on the current-mirror circuit side, and another power input terminal 6 is provided on the active transistor side. A normal input terminal is provided to the active transistor 3 and an inverse input terminal is provided to the active transistor 4.

An output terminal 9 is connected to a connection point between the active transistor 4 and a drain of the output transistor 2 of the current-mirror circuit 11. The output terminal 9 is connected to an input terminal of a next-stage logic circuit 10 which is, for example, an inverter.

As shown in FIG. 3, the first embodiment according to the present invention further comprises an offset correcting circuit 14. The offset correcting circuit 14 is provided between an input point 15 of the current-mirror circuit 11 and a drain of the active transistor 3 of the normal input side.

The offset correcting circuit 14 comprises an inverter 13 which is an inverting-type logic circuit and a transistor 12 which is provided for fixing a drain potential level. The inverter 13 has the same characteristics as a determination potential characteristic, corresponding to "1" and "0", of the next-stage logic circuit 10.

An input terminal of the inverter 13 is connected to the drain of the transistor 3 and a source of the transistor 12. An output terminal of the inverter 13 is connected to a gate of the transistor 12. The drain of the transistor 12 is connected to the input point 15 of the current-mirror circuit 11. That is, a negative feedback control is provided by means of the inverter 13 via the transistor 12 connected as a source follower.

Figure 4A:
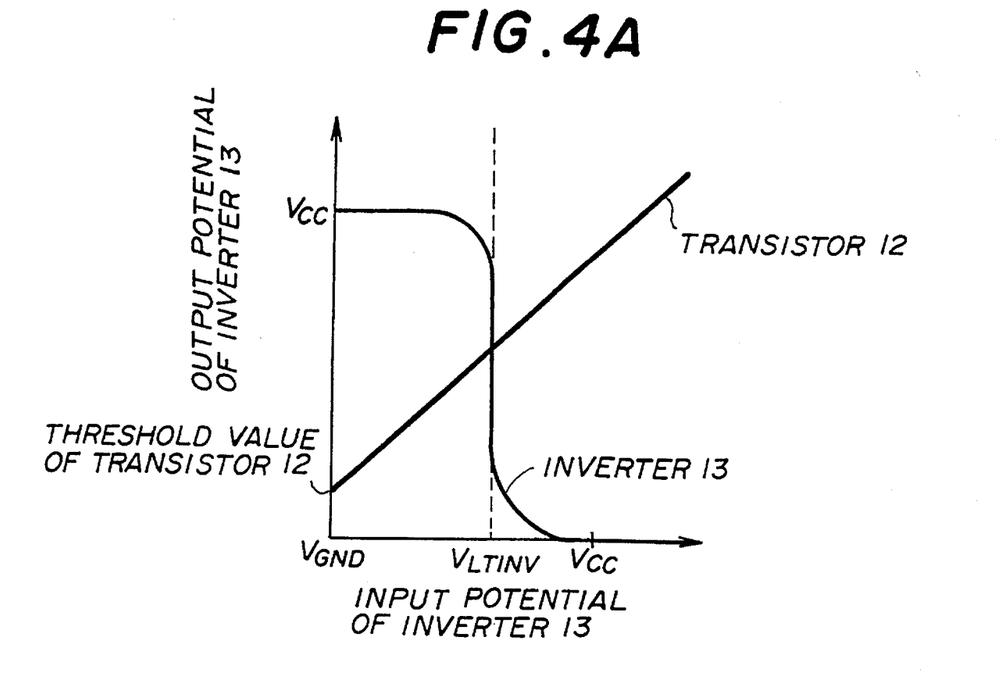
FIGS. 4A and 4B are graphs showing an operational characteristic of an offset correcting circuit shown in FIG. 3.
Figure 4B:
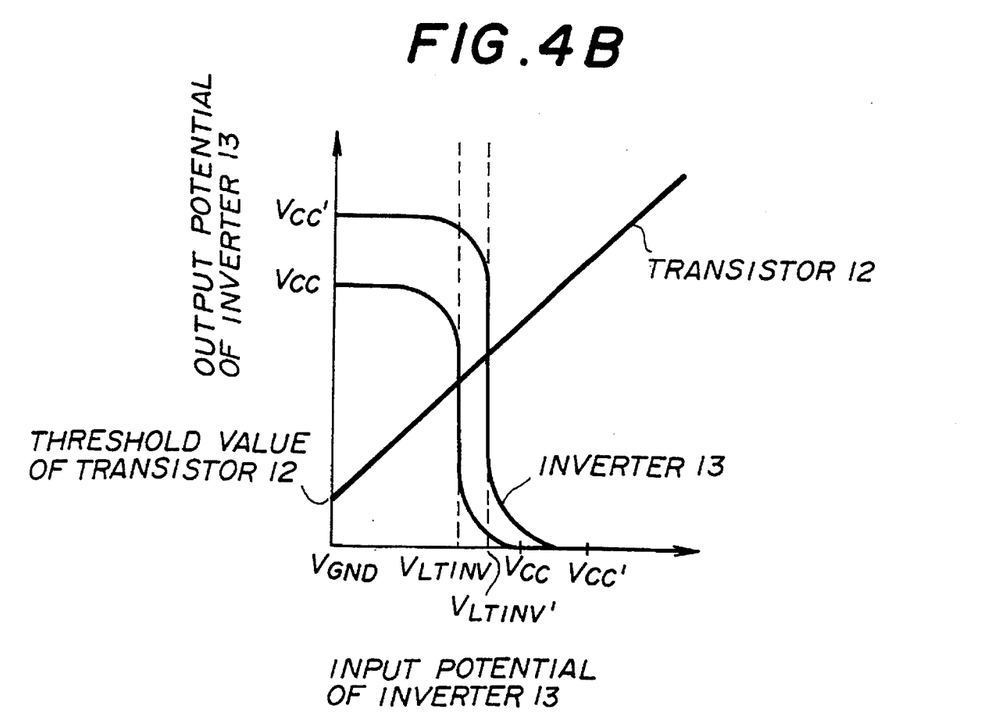

In the above-mentioned structure, a drain potential level (potential level of the connection point 16) of the active transistor 3 of the normal input side is maintained at a potential level $V_{LTINV}$ which is related to the determination potential level of the next-stage logic circuit 10 by means of the offset correcting circuit 14. The potential level $V_{LTINV}$ is determined, as shown in FIGS. 4A and 4B, by characteristics of inverter 13 and the transistor 12 which together constitute the offset correcting circuit 14. It should be noted that FIG. 4A shows a case in which the power source voltage is equal to $V_{CC}$, and FIG. 4B shows a case in which the power source voltage is equal to $V_{CC}'$. The characteristic curve of the inverter 13 at $V_{CC}$ is added in the graph of FIG. 4B for the sake of comparison.

Since the potential level $V_{LTINV}$ at the connection point 16 is maintained at the same level, a lower current is supplied to the current-mirror circuit 11 according to dependency of the saturation current characteristic of the transistors 3 and 4 upon the drain potential $V_D$. Accordingly, the determination output potential level $V_{TT}$ becomes closer to the determination potential level $V_{LT}$ of the next-stage logic circuit 10 as compared to the determination output potential level $V_T$ (potential level at the point 15 in FIG. 3) of the conventional circuit.

The determination output potential $V_{TT}$ is approximately represented by the following expression, where j is an inclination (differentiation) of a drain current with respect to drain voltage of the active transistors 3 and 4, and j' is an inclination (differentiation) of a drain current with respect to the drain voltage of the transistor 2.

$$V_{TT}=(jV_{LTINV}+j'V_T)/(j+j')$$

Since if $V_{LTINV}=\alpha'V_{CC}$, $V_{LT}=\alpha V_{CC}$, and thus $V_{LTINV}$ is represented by the following expression, where $\alpha$ is a constant of the transistor used in the next-stage logic circuit 10, and $\alpha'$ is a constant of the transistor used in the inverter 13.

$$V_{LTINV}=\alpha'V_{LT}/\alpha$$

Accordingly, $V_{TT}$ is represented by the following expression.

$$V_{TT}=(\alpha'jV_{LT}/\alpha+j'V_T)/(j+j')$$

In the above expression, if the inclination j is nearly equal to 0 and $\alpha'=\alpha$, $V_{TT}$ can be nearly equal to $V_{LT}$. That is, the determination output potential level of the present invention is equal to $V_{TT}$ (=$V_{LT}$), the determination output potential level of the conventional circuit is nearly equal to $V_T$.

Figure 5A:
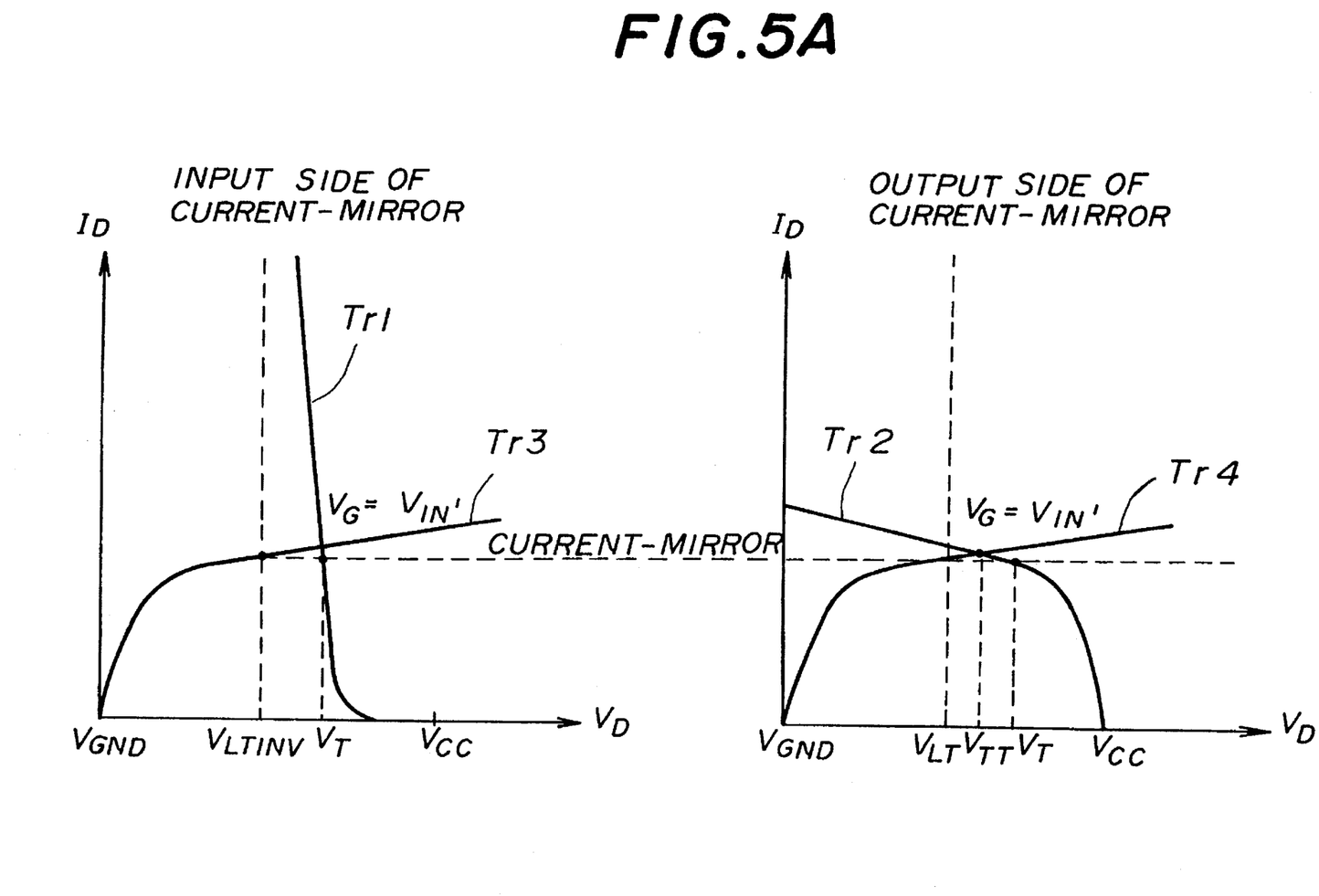
FIGS. 5A and 5B are graphs showing drain voltage - drain current characteristic curves of the transistors shown in FIG. 3.
Figure 5B:
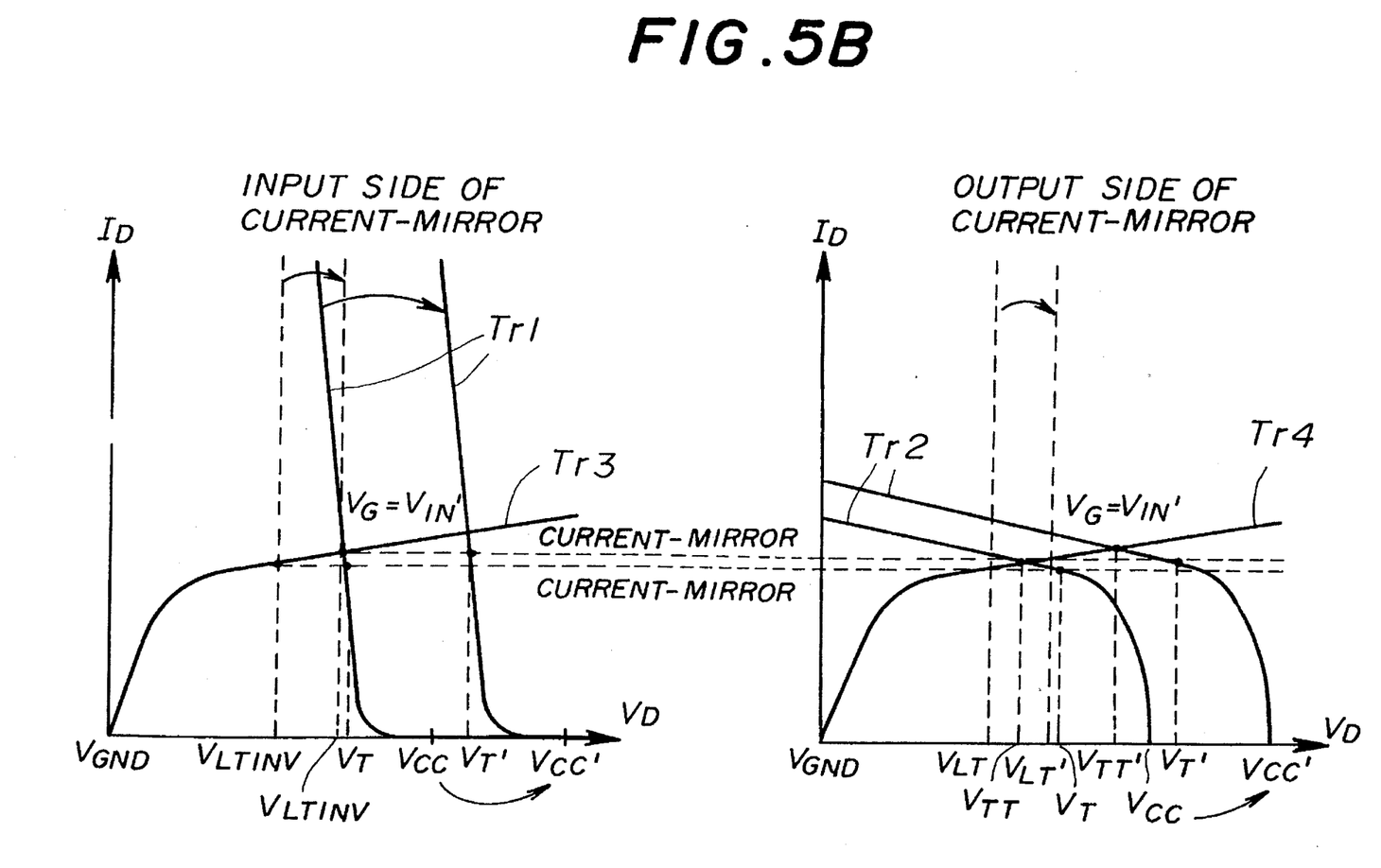

Additionally, as shown in FIG. 5B, even if the power source voltage is varied from $V_{CC}$ to $V_{CC}'$, the difference between the determination potential level $V_{LT}'$ and $V_{TT}'$ against $V_{CC}$ is lessened, and thus an occurrence of the determination error is reduced.

As mentioned above, by providing the offset correction circuit 14 between the active transistor 3 of the normal input side and the input point of the current-mirror circuit 11, the drain voltage of the transistor 3 can be closer to the determination potential level, corresponding to "1" and "0", of the next-stage logic circuit 10, and thus an occurrence of the offset can be reduced.

Additionally, since the offset correcting circuit 14 can be materialized in a simple construction, such as the combination of the inverter 13 and the transistor 12, a complex circuit and an increase in element size can be eliminated.

It should be noted that the effect of the present embodiment can be achieved when the channel type of each of the transistors 1, 2, 3 and 4 is reversed, respectively. Additionally, the effect of the present embodiment can be obtained when an amplification ratio of the current-mirror circuit 11 or a conductance ratio of the pair of active transistors 3 and 4 is a different value.

Figure 6:
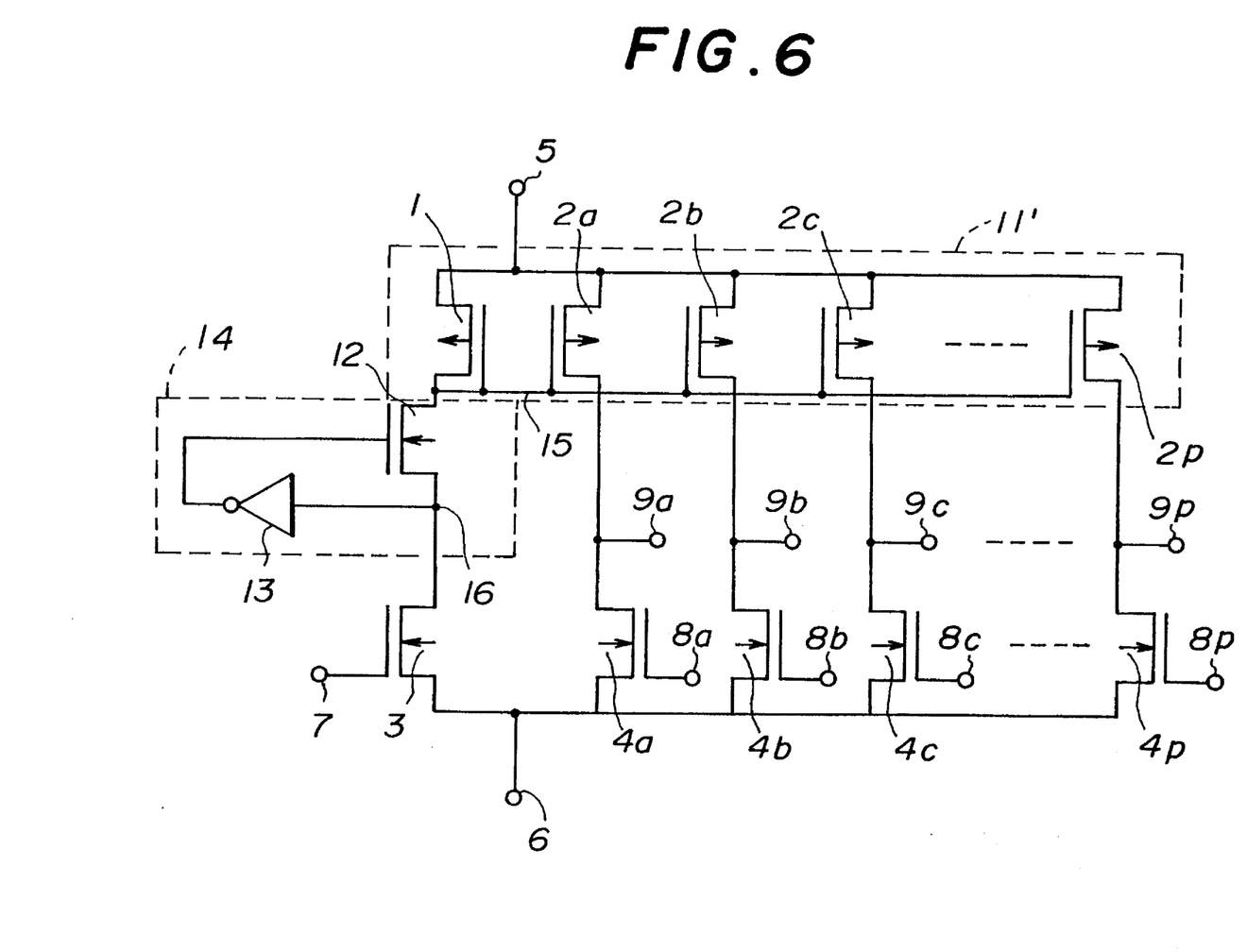
FIG. 6 is a circuit diagram of a second embodiment of an potential comparing circuit according to the present invention.

A description will now be given, with reference to FIG. 6, of a second embodiment according to the present invention. FIG. 6 is a circuit diagram of the second embodiment of an potential comparing circuit according to the present invention. In FIG. 6, parts that are the same as the parts shown in FIG. 3 are given the same reference numerals.

The potential comparing circuit of this embodiment comprises a multi-current-mirror circuit 11'. An offset correcting circuit 14 is provided on an input side of the multi-current-mirror circuit 11'. The multi-mirror-circuit 11' comprises a transistor 1 and transistors 2a to 2p instead of the transistor 2 of the above-mentioned first embodiment. Accordingly, active transistors 4a to 4p, which correspond to the transistors 2a to 2p, are provided instead of transistor 4 of the first embodiment.

A gate of each of the transistors 2a to 2p is connected to an input point 15 of the multi-current-mirror circuit 11'. Each of the transistors 2a to 2p performs the same operation. Each of output terminals 9a to 9p is provided on a corresponding connection point between a drain of each of the transistors 2a to 2p and a drain of each of the active transistors 4a to 4p. A source of each of the active transistors 4a to 4p is connected to a power input terminal 6. A gate of each of the active transistors 4a to 4p is connected to a corresponding inverse input terminal 8a to 8p.

According to the second embodiment of the present invention, a single reference potential level (normal input) can be compared with a plurality of potential levels at the same time. In this embodiment, only a single offset correcting circuit 14 is shared with a plurality of active transistors 4a to 4p, and thus the number of circuit elements can be reduced as compared to a structure in which an offset correcting circuit is provided for each of the active transistors 4a to 4p. It should be noted that, in this case, all of the determination potential levels of the next-stage logic circuit should be the same value.

The present invention is not limited to the specifically disclosed embodiments, and variations and modifications may be made without departing from the scope of the present invention.

What is claimed is:

1. A potential comparing circuit which compares a potential level of a first input signal with a potential level of a second input signal so as to output an output signal having a potential level to be supplied to a next-stage logic circuit which uses predetermined determination potential levels corresponding to "1" and "0", the potential comparing circuit comprising:

a current-mirror circuit, connected to a first power source, and having an input point and an output point;

a first transistor having a gate to which said first input signal is supplied;

a second transistor having a gate to which said second input signal is supplied, a channel type of said second transistor being the same as a channel type of said first transistor, a source of said second transistor being connected to a source of said first transistor, a drain of said second transistor being connected to said output point of said current-mirror circuit, a second power source being connected to a connection point between the source of said first transistor and the source of said second transistor; and an offset correcting circuit provided between a drain of said first transistor and said input point of said current-mirror, said offset correcting circuit having operating characteristics that are substantially the same as the next-stage logic circuit so as to substantially equalize a potential level obtained at a drain of said first transistor with specific potential levels related to said specific determination potential levels of the next-stage logic circuit, said output signal being output from a point between the drain of said second transistor and said output point of said current-mirror circuit.

2. The potential comparing circuit as claimed in claim 1, wherein said offset correcting circuit comprises a third transistor being a channel type the same as the channel type of said first and second transistors and an inverting-type logic circuit having determination potential levels the same as that of said next-stage logic circuit, the drain of said first transistor being connected to a source of said third transistor and an input of said inverting-type logic circuit of said offset correcting circuit, a drain of said third transistor being connected to said input point of said current-mirror circuit, a gate of said third transistor being connected to an output of said inverting-type logic circuit of said offset correcting circuit.

3. The potential comparing circuit as claimed in claim 1, wherein said current-mirror circuit comprises a fourth transistor and a fifth transistor, each of said fourth transistor and said fifth transistor being a channel type different from the channel type of said first and second transistors, a gate of each of said fourth and fifth transistors and a drain of said fourth transistor being connected to said input point of said current-mirror circuit, a source of said fourth transistor being connected to a source of said fifth transistor, said first power source being connected to a connection point between the sources of said fourth and fifth transistors, a drain of said fifth transistor being connected to said output point of said current-mirror circuit.

4. The potential comparing circuit as claimed in claim 2 wherein said inverting-type logic circuit comprises an inverter.

5. A potential comparing circuit which compares a potential level of a first input signal with a potential level of each of a plurality of second input signals so as to output a plurality of output signals each having a potential level to be supplied to a next-stage logic circuit which uses predetermined determination potential levels corresponding to "1" and "0", the potential comparing circuit comprising:

a current-mirror circuit, connected to a first power source, having an input point and a plurality of output points;

a first transistor having a gate to which said first input signal is supplied;

a plurality of second transistors each having a gate to which a corresponding one of said second input signals is supplied, a channel type of each of said second transistors is the same as a channel type of said first transistor, a source of each of said second transistor being connected to a source of said first transistor, a drain of each of said second transistors being connected to a corresponding one of said output points of said current-mirror circuit, a second power source being connected to the source of said first transistor; and an offset correcting circuit, provided between a drain of said first transistor and said input point of said current-mirror circuit, for correcting a potential level obtained at a drain of said first transistor to correspond to specific potential levels related to said specific determination potential levels, said output signals being output from a point between the drain of each of said second transistors and each of said output points of said current-mirror circuit.

6. The potential comparing circuit as claimed in claim 5, wherein said offset correcting circuit comprises a third transistor being a channel type the same as the channel type of said first and second transistors and an inverting-type logic circuit having determination potential levels the same as that of said next-stage logic circuit, the drain of said first transistor being connected to a source of said third transistor and an input of said inverting-type logic circuit of said offset correcting circuit, a drain of said third transistor being connected to said input point of said current-mirror circuit, a gate of said third transistor being connected to an output of said inverting-type logic circuit of said offset correcting circuit.

7. The potential comparing circuit as claimed in claim 5, wherein said current-mirror circuit comprises a fourth transistor and a plurality of fifth transistors, each of said fourth transistor and said fifth transistors being a channel type different from the channel type of said first and second transistors, a gate of each of said fourth and fifth transistors and a drain of said fourth transistor being connected to said input point of said current-mirror circuit, a source of said fourth transistor being connected to a source each of said fifth transistors, said first power source being connected to the source of said fourth transistor, and a drain of each of said fifth transistors being connected to a corresponding one of output points of said current-mirror circuit.

8. The potential comparing circuit as claimed in claim 6, wherein said inverting-type logic circuit comprises an inverter.

9. A potential comparing circuit which compares a potential level of a first input signal with a potential level of a second input signal so as to output an output signal having a potential level substantially equalized to predetermined determination potential levels of a next-stage logic circuit, the potential comparing circuit comprising:

first and second transistors each having a first contact to which one of the first and second input signals is supplied, and a second contact connected to a first power source, and wherein a channel type of said second transistor is the same as a channel type of said first transistor, a current-mirror circuit connected to a first power source, and having an input point and an output point, said output point being connected to a third contact of said second transistor such that the output signal is output from a point between said third contact of said second transistor and said output point of said current-mirror circuit; and an offset correcting circuit connected between a third contact of said first transistor and said input point of said current-mirror, said offset correcting circuit having operating characteristics that are substantially the same as the next-stage logic circuit so as to substantially equalize a potential level obtained at said third contact of said first transistor with specific potential levels related to said specific determination potential levels of the next-stage logic circuit.

10. The potential comparing circuit according to claim 9, wherein said first, second and third contacts of said first transistor comprise a gate, a source and a drain respectively.

11. The potential comparing circuit according to claim 9, wherein said first, second and third contacts of said second transistor comprise a gate, a source and a drain respectively.

12. The potential comparing circuit according to claim 9, wherein said offset correcting circuit comprises an inverting-type logic circuit having substantially the same operating characteristics of the next-stage logic circuit and an input connected to said third contact of said first transistor; and a third transistor having a first contact connected to an output of said inverting-type circuit, a second contact connected to said third contact of said first transistor and a third contact connected to said input point of said current-mirror.

13. The potential comparing circuit according to claim 12, wherein said first, second and third contacts of said third transistor comprise a gate, a source and a drain respectively.

* * * * *